United States Patent [19]
Tzu et al.

[11] Patent Number: 5,792,578
[45] Date of Patent: Aug. 11, 1998

[54] METHOD OF FORMING MULTIPLE LAYER ATTENUATING PHASE SHIFTING MASKS

[75] Inventors: San-De Tzu, Taipei; Jia-Jing Wang, Hsinchu; Chih-Chiang Tu, Tau-yeng; Wen-Hong Huang, Hsin-Chu, all of Taiwan

[73] Assignee: Taiwan Semiconductor Manufacturing Company Ltd., Hsin-Chu, Taiwan

[21] Appl. No.: 782,705

[22] Filed: Jan. 13, 1997

[51] Int. Cl.[6] .................................................. G03F 9/00
[52] U.S. Cl. ........................................... 430/5; 216/12
[58] Field of Search ........................ 430/5; 216/12

[56] References Cited

U.S. PATENT DOCUMENTS

| | | | |
|---|---|---|---|
| 5,272,024 | 12/1993 | Lin | 430/5 |
| 5,382,483 | 1/1995 | Young | 430/5 |
| 5,418,095 | 5/1995 | Vasudev et al. | 430/5 |
| 5,429,897 | 7/1995 | Yoshioka et al. | 430/5 |
| 5,446,587 | 8/1995 | Kang et al. | 359/562 |
| 5,477,058 | 12/1995 | Sato | 250/548 |
| 5,503,951 | 4/1996 | Flanders et al. | 430/5 |
| 5,641,592 | 6/1997 | Kim | 430/5 |

*Primary Examiner*—Christopher D. Rodee
*Assistant Examiner*—Steven H. VerSteeg
*Attorney, Agent, or Firm*—George O. Saile; Stephen B. Ackerman; Larry J. Prescott

[57] ABSTRACT

This invention describes a new method of forming a double layer attenuating phase shifting mask. A first pattern is formed in a layer of attenuating phase shifting material and an alignment pattern is formed in a layer of opaque material. A first resist is used to form the first pattern. A pellicle is used to restrict the deposition of a second resist to the alignment region of the mask only and as a result neither the first resist nor the second resist must withstand dry etching steps. The first resist is removed before the step of forming the first pattern in the attenuating phase shifting material and cleaning before this step is carried out is thereby improved.

22 Claims, 10 Drawing Sheets

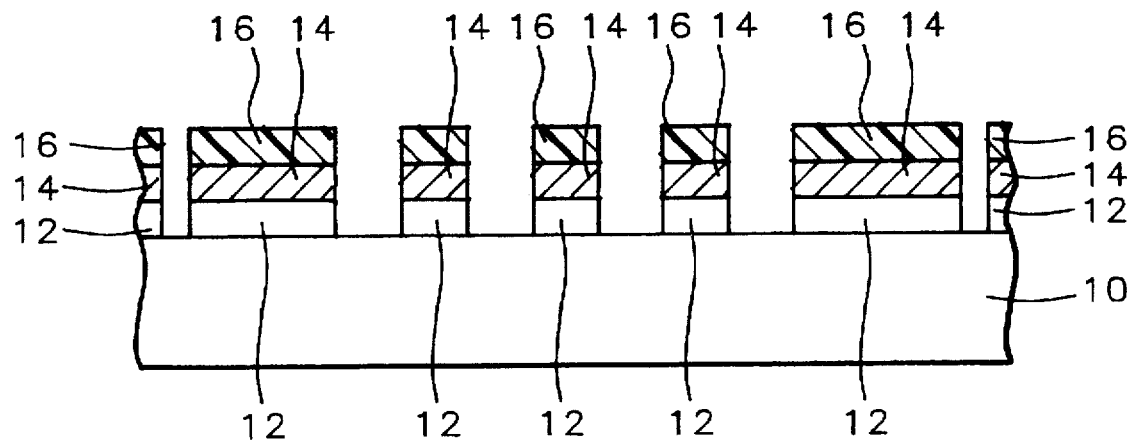
FIG. 2A - Prior Art
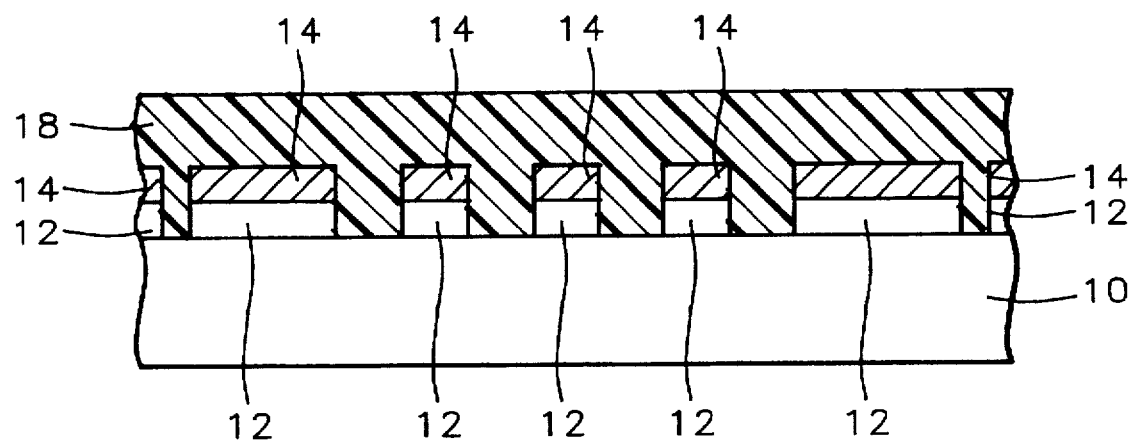
FIG. 2B - Prior Art

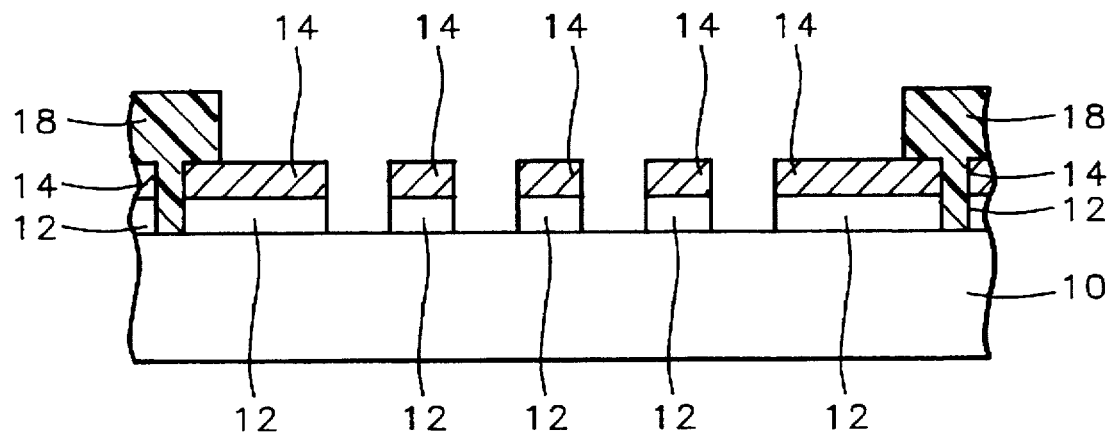
*FIG. 2C - Prior Art*
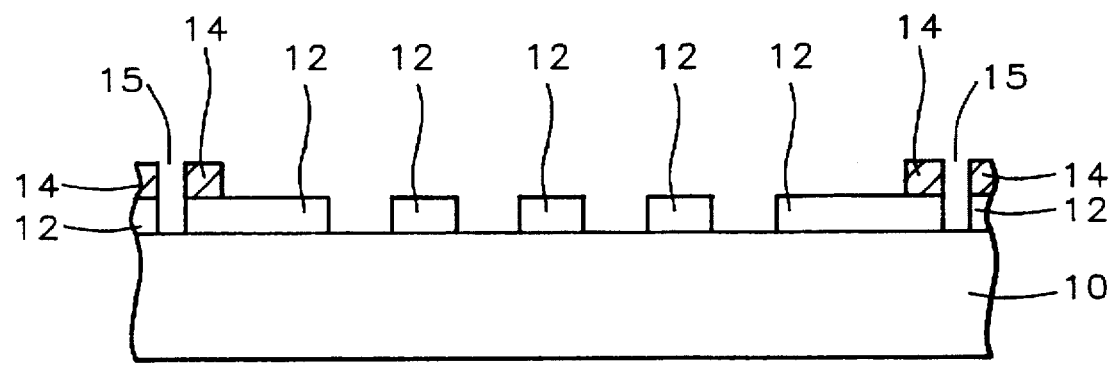
*FIG. 2D - Prior Art*

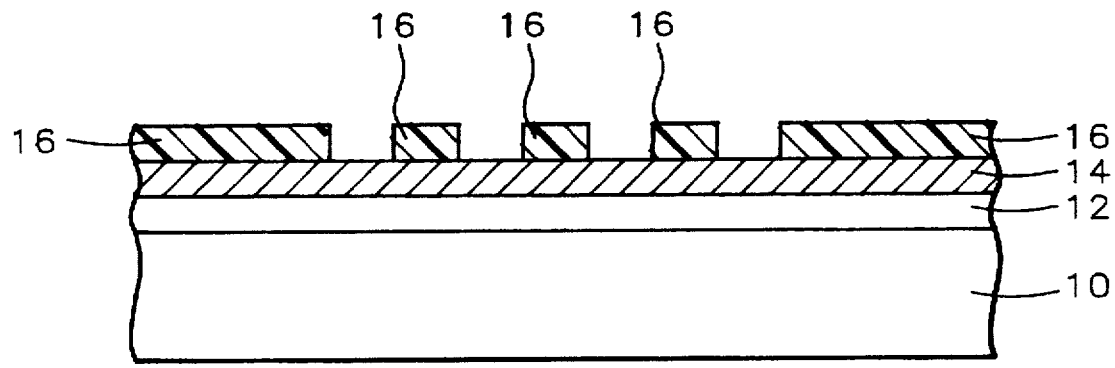
FIG. 3A - Prior Art
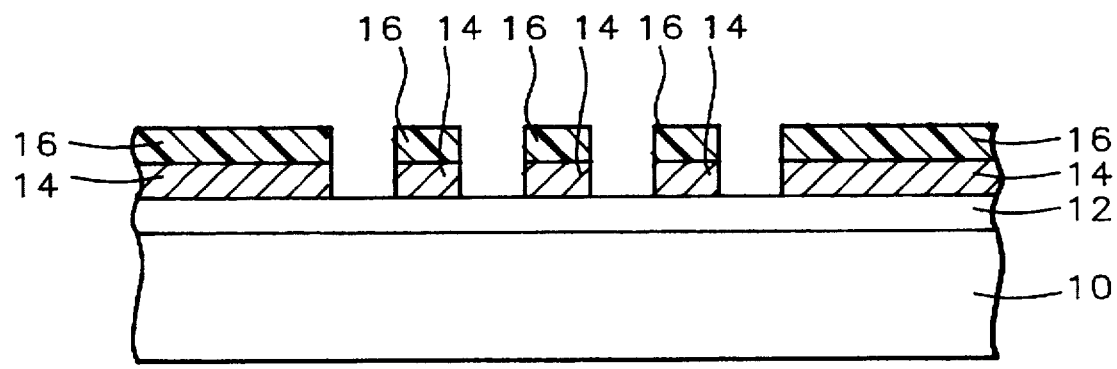
FIG. 3B - Prior Art

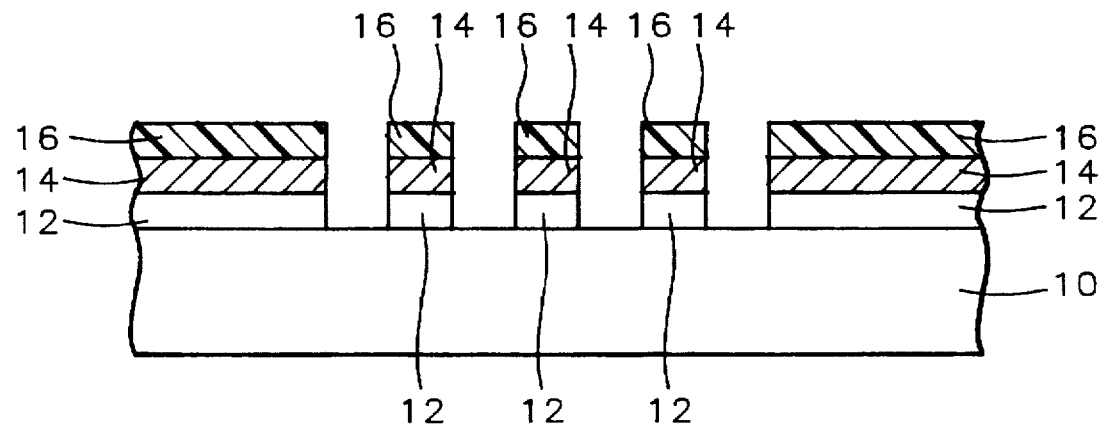
FIG. 4A - Prior Art
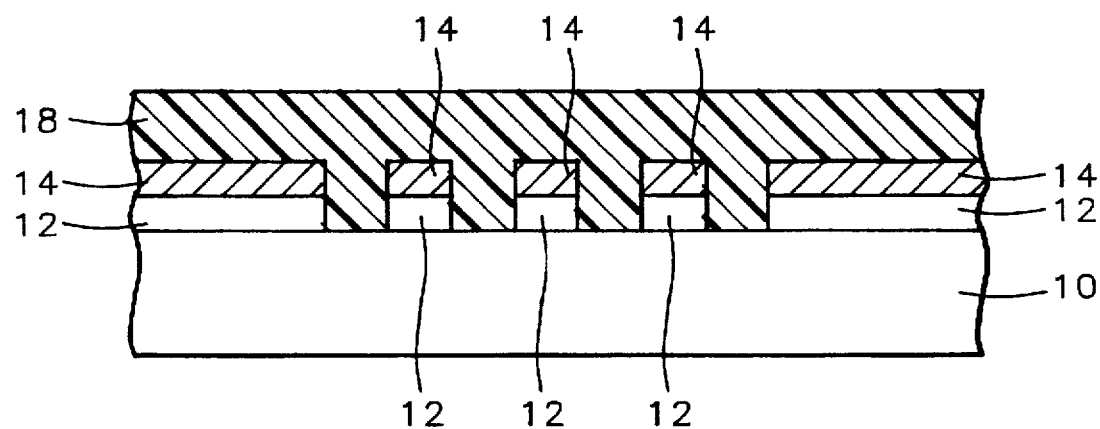
FIG. 4B - Prior Art

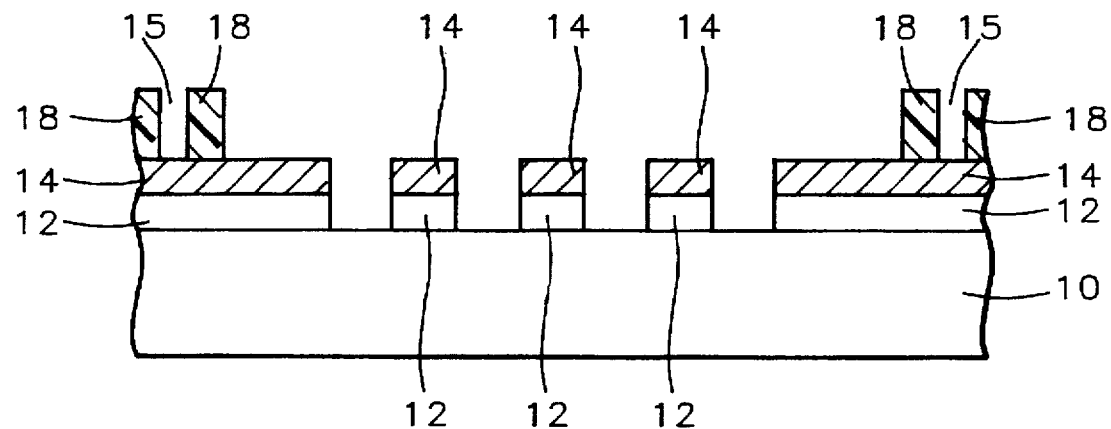
FIG. 4C – Prior Art
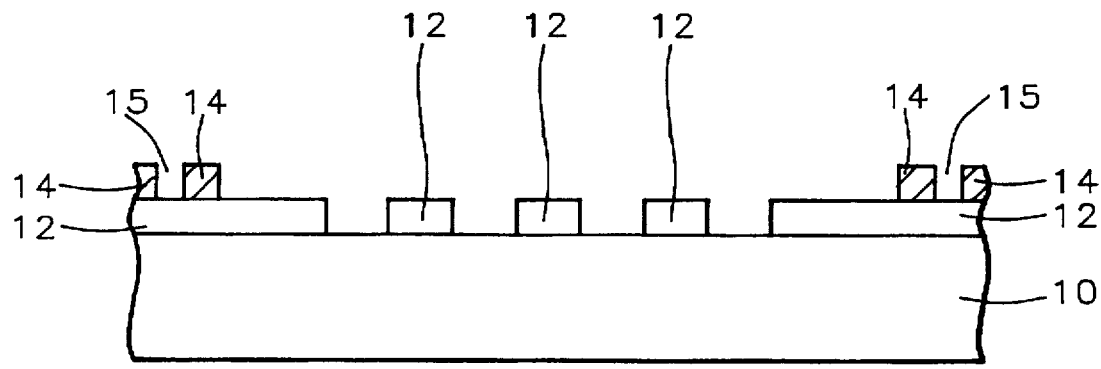
FIG. 4D – Prior Art

METHOD OF FORMING MULTIPLE LAYER ATTENUATING PHASE SHIFTING MASKS

BACKGROUND OF THE INVENTION (1) Field of the Invention

This invention relates to a method of forming double layer attenuating phase shifting masks and more particularly to the use of a pellicle to restrict the formation of resist material to particular regions of the mask.

(2) Description of the Related Art

U.S. Pat. No. 5,382,483 to Young describes phase shifting masks using patterned opaque material on a transparent substrate with phase shifting spacers formed at the sidewalls of the patterned opaque material. Self alignment methods are used to form the phase shifting spacers.

U.S. Pat. No. 5,272,024 to Lin describes a method of repairing missing or unwanted phase-shifting elements in a phase shifting mask. First, second, and third phase shifting layers are deposited having phase shifts of θ, 2π-θ, and θ. Repairs are carried out by removing one or two layers of phase-shifting material.

U.S. Pat. No. 5,503,951 to Flanders et al. describes an attenuating phase shifting mask and a method of forming the attenuating phase shifting mask. The mask has recessed attenuating regions relative to the fully transmissive regions.

The Invention disclosed in this Patent Application describes a method of forming double layer attenuating phase shifting masks. An attenuating phase shifting layer is patterned to form an attenuating phase shifting pattern. An opaque layer is used to form alignment patterns for aligning the mask to the semiconductor wafer. A pellicle is used to provide a method having relaxed constraints on resists used in forming the mask and improved cleaning capability between critical fabrication steps.

SUMMARY OF THE INVENTION

Attenuating phase shifting masks are frequently used in the manufacture of integrated circuit elements particularly for those process steps having submicron dimensional tolerance requirements. The attenuating phase shifting materials used in these masks typically have a transmittance of about 8% for light having a wavelength of 365 nanometers, the frequently used i line source. One of the problems in using these masks is that the transmittance of these attenuating phase shifting materials can be greater than 30% at longer wavelengths, above 600 nanometers, making mask alignment difficult.

To overcome the alignment problems of the attenuating phase shifting masks, alignment markings have been formed in a chrome film deposited over the attenuating phase shifting material resulting in a double layer attenuating phase shifting mask. One conventional process flow in forming a double layer attenuating phase shifting mask is shown in FIGS. 1A-2D. FIG. 1A shows a cross section view of a mask substrate 10 with a layer of attenuating phase shifting material 12 formed in the mask substrate and a layer of chrome 14 formed on the attenuating phase shifting material. A layer of first resist 16 is formed on the layer of chrome 14. The first resist must be able to withstand a dry etching step which will be described later. As shown in FIG. 1B, a pattern is formed in the layer of first resist 16. The pattern contains the alignment marks 15 which will be formed in the layer of chrome 14. This pattern, including the alignment marks 15, is then transferred to the layer of chrome 14 by means of wet etching, see FIG. 1C. The mask is then cleaned after the wet etching of the chrome layer to remove any particles resulting from the wet etching. Since it is of critical importance not to damage the first resist 16 during the cleaning process making deionized water is the cleaning agent used.

As shown in FIG. 2A the pattern is then transferred to the layer of attenuating phase shifting material 12 by means of vertical anisotropic dry etching. This dry etching step requires that the layer of first resist 16 have the capability of withstanding a dry etching step. The layer of first resist is then removed and a layer of second resist 18 is formed over the mask substrate 10 covering the patterned layer of attenuating phase shifting material 12 and the patterned layer of chrome 14, see FIG. 2B. The layer of second resist 18 does not need to withstand a dry etching step.

The layer of second resist 18 is then patterned to the chrome alignment pattern, see FIG. 2C. The chrome layer 14 is then patterned to the chrome alignment pattern using wet etching and the patterned layer of second resist as a mask. The layer of second resist is then removed, see FIG. 2D, leaving the alignment marks 15 in the patterned chrome layer 14.

As previously described, it is very difficult to adequately clean the mask between the steps of wet etching of the pattern in the chrome layer and dry etching the layer of attenuating phase shifting material. Particles can be left behind which seriously detracts from the quality of the mask and yield of the mask fabrication.

Another conventional process flow in forming a double layer attenuating phase shifting mask is shown in FIGS. 1A and 3A-4D. FIG. 1A shows a cross section view of a mask substrate 10 with a layer of attenuating phase shifting material 12 formed in the mask substrate and a layer of chrome 14 formed on the attenuating phase shifting material. A layer of first resist 16 is formed on the layer of chrome 14. As in the previous example the first resist must be able to withstand a dry etching step. As shown in FIG. 3A, a pattern is formed in the layer of first resist 16. This pattern is then transferred to the layer of chrome 14 by means of wet etching, see FIG. 3B. The mask is then cleaned after the wet etching of the chrome layer to remove any particles resulting from the wet etching. Since it is of critical importance not to damage the first resist 16 during the cleaning process making deionized water is the cleaning agent used.

As shown in FIG. 4A the pattern is then transferred to the layer of attenuating phase shifting material 12 by means of vertical anisotropic dry etching. This dry etching step requires that the layer of first resist 16 have the capability of withstanding a dry etching step. The layer of first resist is then removed and a layer of second resist 18 is formed over the mask substrate 10 covering the patterned layer of attenuating phase shifting material 12 and the patterned layer of chrome 14, see FIG. 4B. The layer of second resist 18 does not need to withstand a dry etching step.

The layer of second resist 18 is then patterned to the chrome alignment pattern and includes the alignment marks 15, see FIG. 4C. The chrome layer 14 is then patterned to the chrome alignment pattern using wet etching and the patterned layer of second resist as a mask. The layer of second resist is then removed, see FIG. 4D, leaving the alignment marks 15 in the patterned chrome layer 14.

It is an objective of this invention to provide a method for forming multiple layer attenuating phase shifting masks wherein the resist layer used to pattern the opaque layer does not need to be exposed and developed and in which the mask can be thoroughly cleaned after all etching steps.

It is a further objective of this invention to provide a method for forming patterns on a semiconductor wafer using an attenuating phase shifting mask which has been formed using a method in which the resist layer used to pattern the opaque layer does not need to be exposed and developed and in which the mask can be thoroughly cleaned after all etching steps.

These objectives are achieved by using a pellicle to form a pattern in a layer of second resist after using a patterned layer of first resist as a wet etching mask to pattern a layer of opaque material. The patterned layer of first resist can be removed after the pattern has been transferred to the layer of opaque material. The mask can then be thoroughly cleaned since the patterned layer of first resist has been removed.

The pattern is then transferred to the layer of attenuating phase shifting material by means of reactive ion etching using the patterned opaque chrome layer as a mask. The pellicle is then placed over the patterned opaque chrome layer covering all but the periphery of the opaque chrome layer, which will be used for alignment. A layer of second resist is then formed on those areas of the mask not protected by the pellicle. The pellicle is then removed also removing any photoresist that may be on the pellicle. A significant advantage of this method is that the layer of second photoresist is self aligned to the pellicle and does not need to be exposed or developed. The layer of second photoresist is baked either before or after the pellicle is removed. That part of the opaque chrome layer not covered by the layer of second resist is then etched away using wet etching and the mask is cleaned.

BRIEF DESCRIPTION OF THE DRAWINGS

FIG. 2A shows a cross section view of a mask substrate having a layer of attenuating phase shifting material, a pattern layer of chrome, and a patterned layer of first resist formed thereon and the pattern, including alignment marks, formed in the layer of attenuating phase shifting material and the layer of chrome using dry vertical anisotropic etching.

FIG. 2B shows a cross section view of a mask substrate having a patterned layer of attenuating phase shifting material, a pattern layer of chrome, and a layer of second resist formed thereon.

FIG. 2C shows a cross section view of a mask substrate having a patterned layer of attenuating phase shifting material, a pattern layer of chrome, and a patterned layer of second resist formed thereon.

FIG. 2D shows a cross section view of a mask substrate having a patterned layer of attenuating phase shifting material and a patterned layer of chrome, including alignment marks, formed thereon.

FIG. 3A shows a cross section view of a mask substrate having a layer of attenuating phase shifting material, a layer of chrome, and a layer of first resist formed thereon and a pattern formed in the layer of first resist.

FIG. 3B shows a cross section view of a mask substrate having a layer of attenuating phase shifting material, a layer of chrome, and a patterned layer of first resist formed thereon and the pattern formed in the layer of chrome using wet etching.

FIG. 4A shows a cross section view of a mask substrate having a layer of attenuating phase shifting material, a pattern layer of chrome, and a patterned layer of first resist formed thereon and the pattern formed in the layer of attenuating phase shifting material chrome using dry vertical anisotropic etching.

FIG. 4B shows a cross section view of a mask substrate having a patterned layer of attenuating phase shifting material, a pattern layer of chrome, and a layer of second resist formed thereon.

FIG. 4C shows a cross section view of a mask substrate having a patterned layer of attenuating phase shifting material, a pattern layer of chrome, and a patterned layer of second resist, including alignment marks, formed thereon.

FIG. 4D shows a cross section view of a mask substrate having a patterned layer of attenuating phase shifting material, and a patterned layer of chrome formed thereon wherein the patterned layer of chrome includes alignment marks.

DESCRIPTION OF THE PREFERRED EMBODIMENTS

Figure 1A:
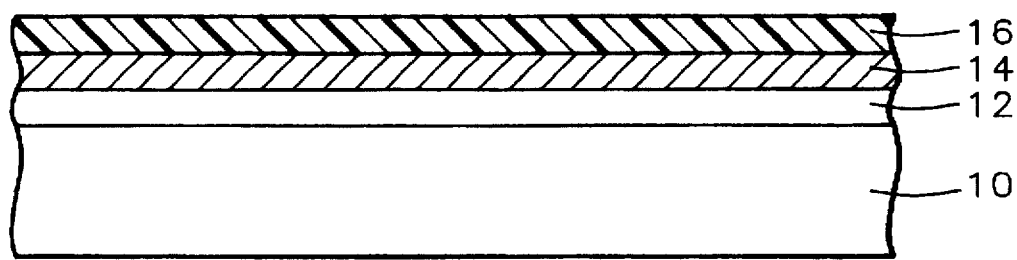
FIG. 1A shows a cross section view of a mask substrate having a layer of attenuating phase shifting material, a layer of chrome, and a layer of first resist formed thereon.

Refer now to FIGS. 1A–1C and FIGS. 5–10 for a detailed description of the embodiment of a method of forming the attenuating phase shifting mask of this invention. FIG. 1A shows a transparent mask substrate 10 formed of a material such as quartz having a thickness of about 0.25 inches. A layer of attenuating phase shifting material 12, such as MoSiON having a thickness of between about 80 and 120 nanometers or CrON having a thickness of between about 100 and 140 nanometers, is deposited on the transparent mask substrate 10. The layer of attenuating phase shifting material 12 has a transmittance of between about 6% and 10% for light having a wavelength of 365 nanometers, such as an i line source. A layer of opaque material 14, such as chrome having a thickness of between about 80 and 120 nanometers, is deposited on the layer of attenuating phase shifting material. A layer of first resist 16 is formed on the layer of opaque material 14. Unlike the conventional methods described earlier, the first resist material will have to withstand wet etching only and will not be subjected to dry etching steps. This allows greater latitude in the selection of the first resist material and permits the use of a resist having a higher sensitivity.

Figure 1B:
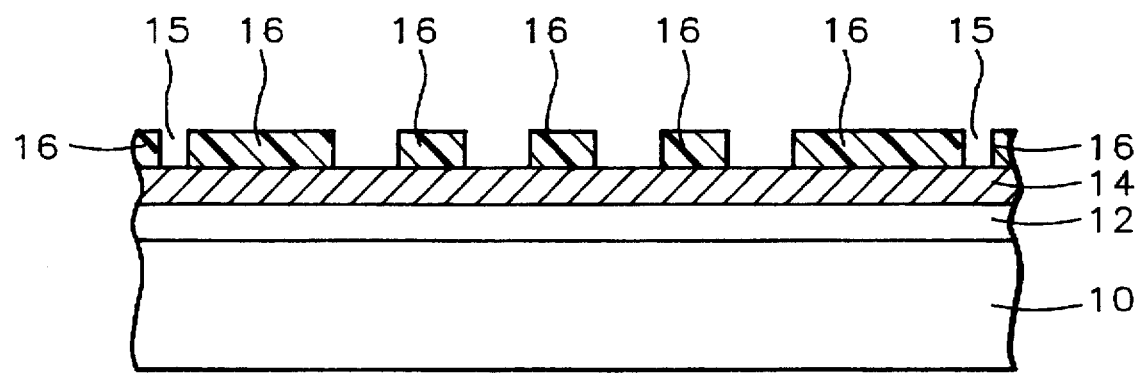
FIG. 1B shows a cross section view of a mask substrate having a layer of attenuating phase shifting material, a layer of chrome, and a layer of first resist formed thereon and a pattern, including alignment marks, formed in the layer of first resist.
Figure 1C:
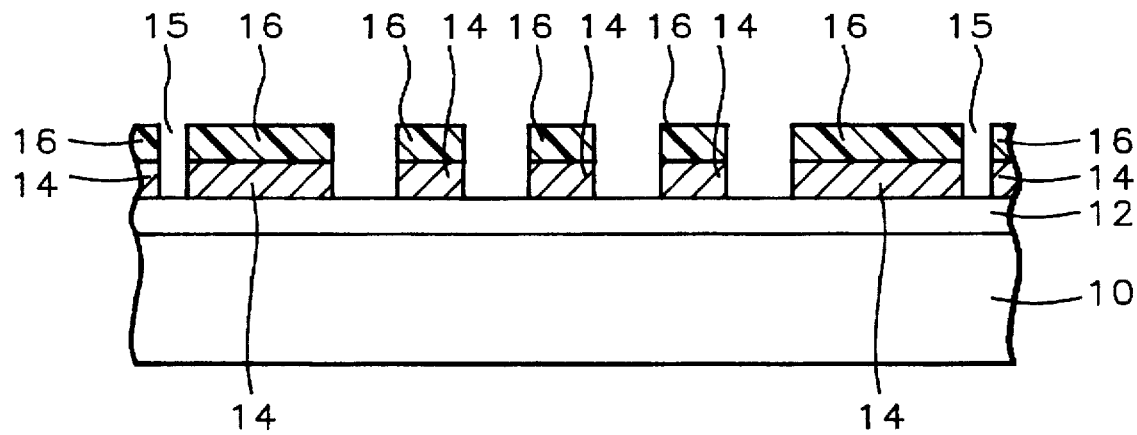
FIG. 1C shows a cross section view of a mask substrate having a layer of attenuating phase shifting material, a layer of chrome, and a patterned layer of first resist formed thereon and the pattern, including alignment marks, formed in the layer of chrome using wet etching.
Figure 5:
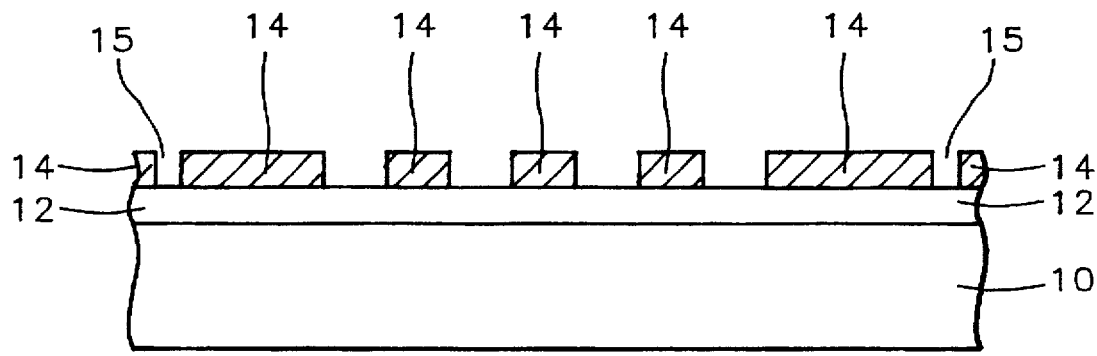
FIG. 5 shows a cross section view of a mask substrate with a layer of attenuating phase shifting material and a patterned layer of chrome, including alignment marks, formed thereon.
Figure 6:
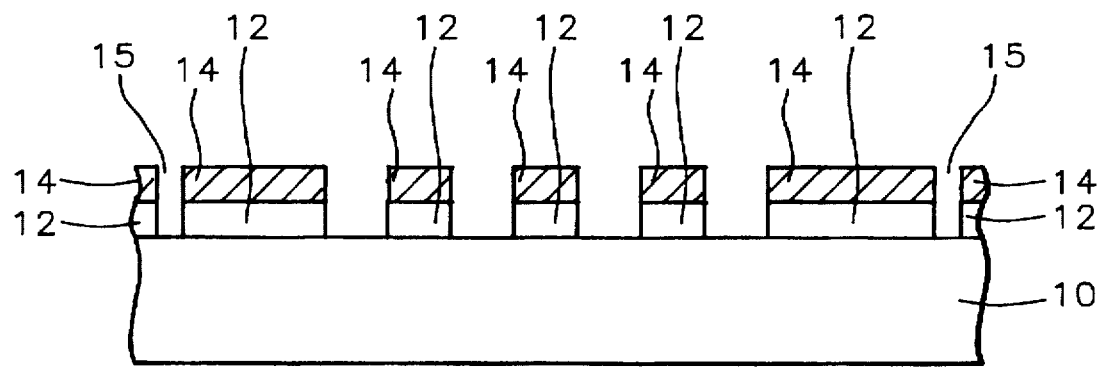
FIG. 6 shows a cross section view of a mask substrate with a patterned layer of attenuating phase shifting material and a patterned layer of chrome, including alignment marks, formed thereon.
Figure 7:
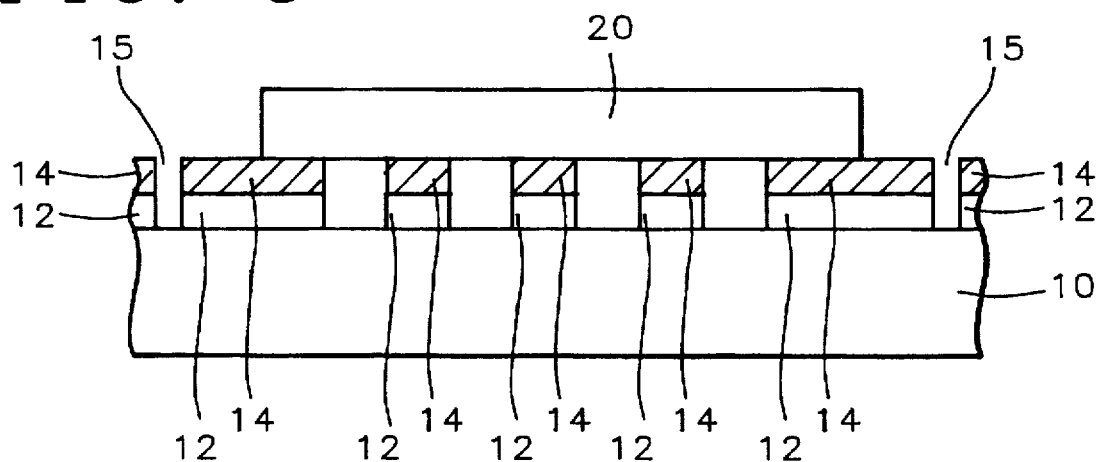
FIG. 7 shows a cross section view of a mask substrate with a patterned layer of attenuating phase shifting material and a patterned layer of chrome formed thereon, and a pellicle placed on the patterned layer of chrome.

Next, as shown in FIG. 1B, a first pattern, including alignment marks 15, is formed in the layer of first resist material 16. As shown in FIG. 1C, the first pattern, including alignment marks 15, is then formed in the layer of opaque material 14 by means of wet etching using the first pattern formed in the layer of first resist material as a mask. Next, as shown in FIG. 5, the layer of first resist material is removed and the mask is cleaned thoroughly. Since there is no concern regarding damage to the layer of first resist material cleaning agents such as $H_2O_2+H_2SO_4$ followed by $H_2O+NH_4OH+H_2O_2$ or the like may be used. In this case the cleaning is much more thorough and effective than using only deionized water. Next as shown in FIG. 6 the first pattern, including the alignment marks 15, is etched in the layer of attenuating phase shifting material 12 by means of reactive ion etching using the first pattern formed in the layer of opaque material 14 as a mask. Next, as shown in FIG. 7 a pellicle 20, formed of a material such as aluminum or the like and having a thickness of between about 4 and 6 millimeters, is placed on the layer of opaque material 14 thereby covering the first pattern etched in the layer of opaque material. The pellicle 20 covers the layer of opaque material except for an alignment region at the periphery of the mask where the alignment pattern will be formed in the opaque material.

Figure 8:
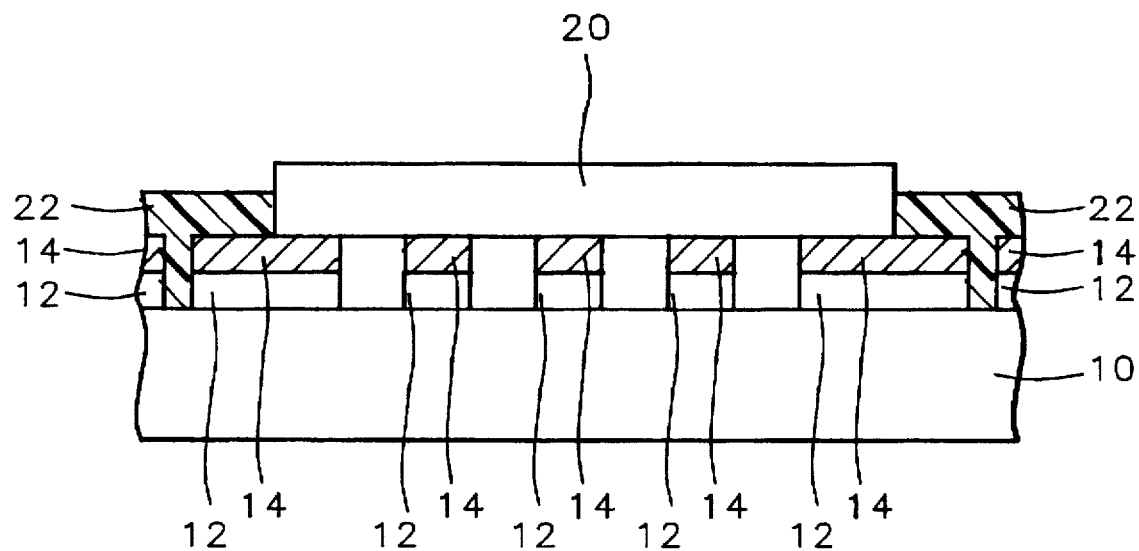
FIG. 8 shows a cross section view of a mask substrate with a patterned layer of attenuating phase shifting material and a patterned layer of chrome formed thereon, a pellicle placed on the patterned layer of chrome, and a layer of second resist formed over the mask.
Figure 9:
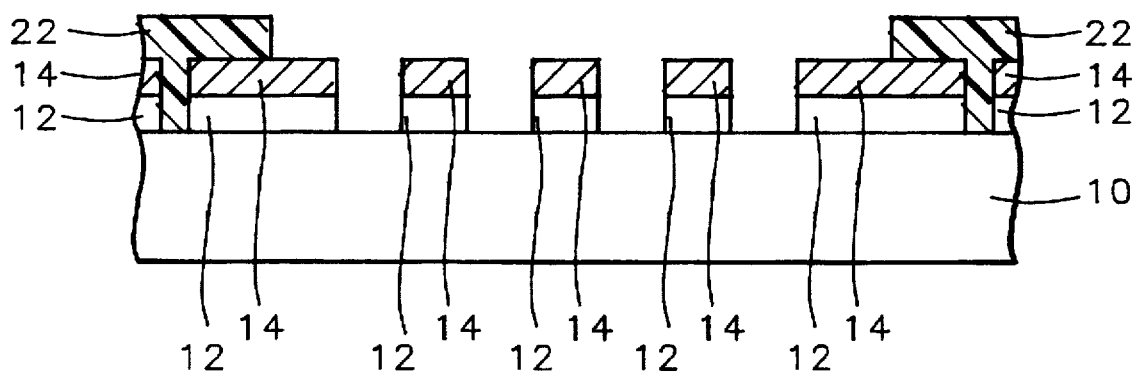
FIG. 9 shows a cross section view of the mask of FIG. 8 after the pellicle has been removed.
Figure 10:
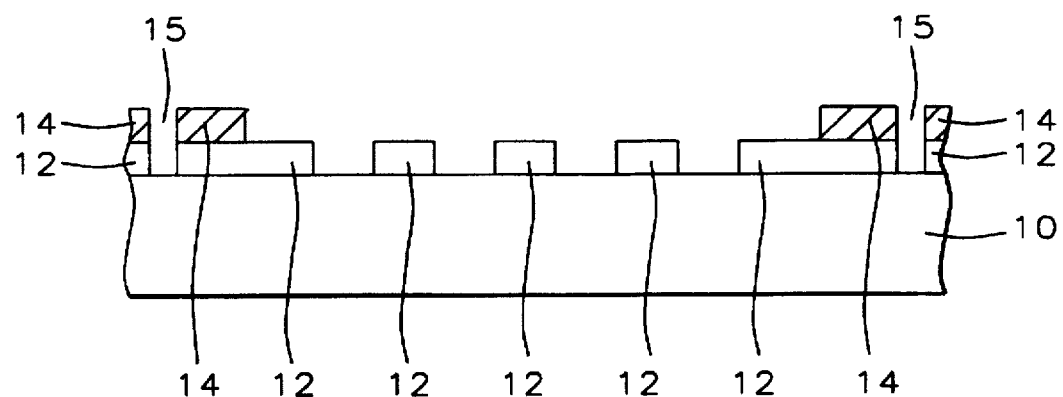
FIG. 10 shows a cross section view of a mask substrate having a patterned layer of attenuating phase shifting material, and a patterned layer of chrome formed thereon wherein alignment marks are formed in the patterned layer of chrome.

Next, as shown in FIG. 8, a second resist material 22 is dispensed over the mask. The second resist material forms at the edges of the pellicle covering the alignment region of the layer of opaque material 14. The second resist material 22 is then baked and the pellicle is removed, or the pellicle is removed then the second resist material is baked, leaving baked second resist material 22 over the alignment region of the layer of opaque material 14, see FIG. 9. An advantage of this method is that the second resist material does not need to be exposed or developed. Next, as shown in FIG. 10, that part of the layer of opaque material not covered by the second resist material is etched away using wet etching and the second resist material is removed. The attenuating phase shifting mask is then complete having a first pattern formed in the layer of attenuating phase shifting material 12 and an alignment pattern formed in the layer of opaque material.

Figure 11:
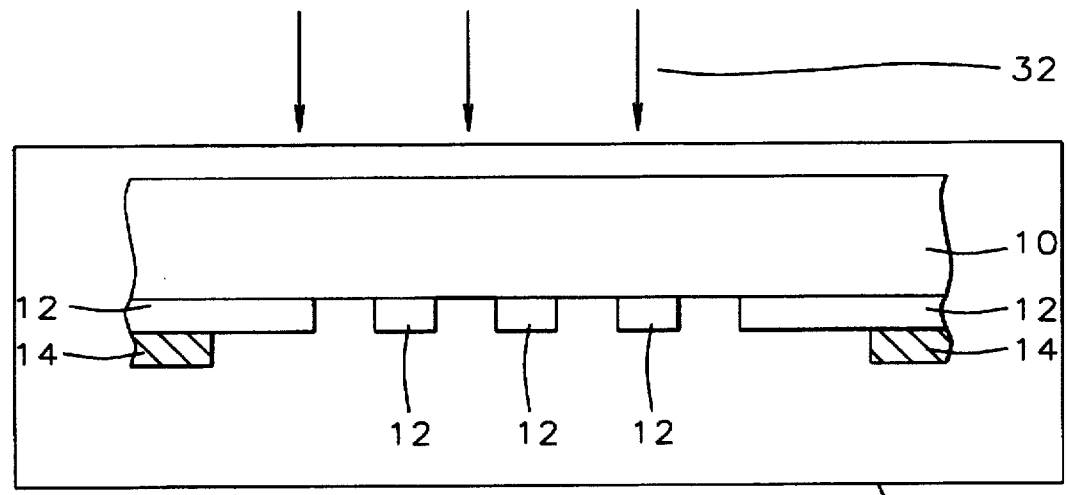
FIG. 11 shows a block diagram of a reduction stepper used to expose a semiconductor wafer using the attenuating phase shifting mask of this invention.

Refer now to FIGS. 1A–1C and FIGS. 5–12 for a method of exposing a pattern on a semiconductor wafer using an attenuating phase shifting mask. The attenuating phase shifting mask is formed using the method described in the previous embodiment and shown in FIGS. 1A–1C and FIGS. 5–10. FIG. 11 shows a block diagram of an exposure tool, such as a five times or other reduction stepper, used to expose a pattern on a semiconductor wafer 30. The attenuating phase shifting mask is held in the five times reduction stepper 36. The attenuating phase shifting mask is shown in FIG. 11 as the transparent mask substrate 10, patterned attenuating phase shifting material, and patterned opaque material 14. The mask is illuminated by a beam of light 32, such as from an i line source having a wavelength of 365 nanometers. The light 34 passing through the mask is focussed on the wafer 30.

Figure 12:
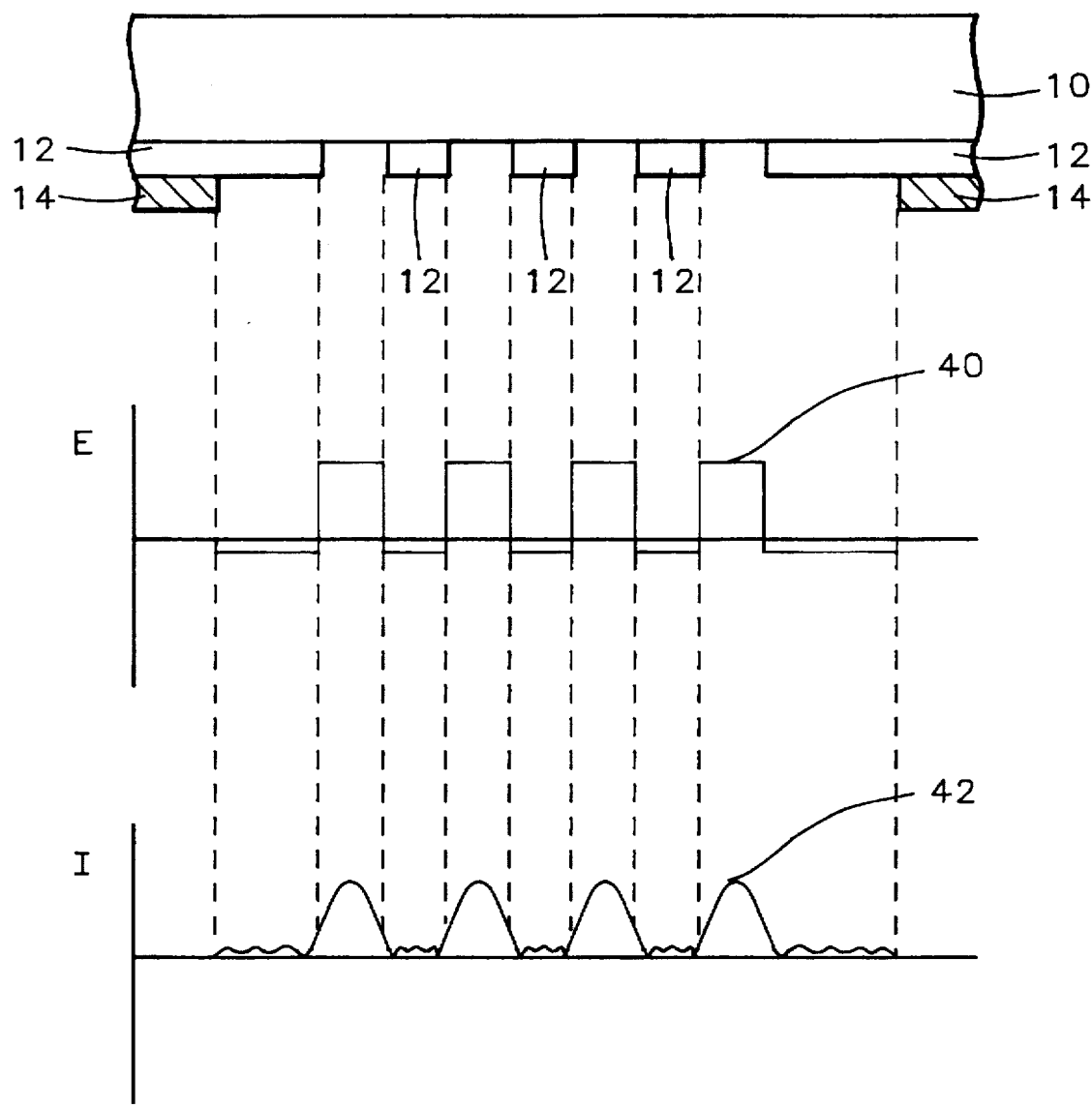
FIG. 12 shows a cross section view of the attenuating phase shifting mask of this invention, the electric field of light passing through the mask, and the intensity of light at the wafer.

FIG. 12 shows a cross section view of the attenuating phase shifting mask, the electric field 40 of the light emerging from the mask, and the intensity 42 of the light at the surface of the semiconductor wafer. The electric field of the light passing through the transparent substrate 10 only is neither shifted in phase nor attenuated. The electric field of the light passing through both the transparent mask substrate and the attenuating phase shifting material 12 is both attenuated and shifted in phase by 180°. The electric field of the light corresponding the opaque regions of the mask is zero. The intensity 42 of the light at the semiconductor wafer has sharp changes corresponding to the first pattern formed in the attenuating phase shifting material 12 resulting from interference between the light passing through the transparent mask substrate 10 only and the light passing through both the attenuating phase shifting material 12 and the transparent mask substrate 10.

While the invention has been particularly shown and described with reference to the preferred embodiments thereof, it will be understood by those skilled in the art that various changes in form and details may be made without departing from the spirit and scope of the invention.

What is claimed is:

1. A method of forming attenuating phase shift masks, comprising the steps of:

providing a transparent mask substrate having a primary surface;

forming a layer of attenuating phase shifting material on said primary surface of said transparent mask substrate;

forming a layer of opaque material on said layer of attenuating phase shifting material wherein said layer of opaque material consists of a pattern region and an alignment region and said alignment region is at the periphery of said layer of opaque material;

patterning said layer of opaque material thereby forming a first pattern in said pattern region of said layer of opaque material;

forming said first pattern in said layer of attenuating phase shifting material by means of reactive ion etching using said first pattern in said pattern region of said layer of opaque material as a mask;

placing a pellicle over said pattern region of said layer of opaque material after forming said first pattern in said layer of attenuating phase shifting material wherein said pellicle covers said pattern region of said layer of opaque material and does not cover said alignment region of said layer of opaque material;

dispensing a layer of resist material over said alignment region of said layer of opaque material;

removing said pellicle after dispensing said layer of resist material;

baking said layer of resist material thereby forming a mask in said layer of resist material wherein resist material covers said alignment region of said layer of opaque material;

etching away said pattern region of said layer of opaque material using wet etching and said mask formed in said layer of resist material; and removing said layer of resist material after etching away said pattern region of said layer of opaque material thereby forming an attenuating phase shifting mask.

2. The method of claim 1 wherein said layer of attenuating phase shifting material is MoSiON having a thickness of between about 80 and 120 nanometers.

3. The method of claim 1 wherein said layer of attenuating phase shifting material is CrON having a thickness of between about 100 and 140 nanometers.

4. The method of claim 1 wherein said layer of attenuating phase shifting material has a transmittance of between about 6% and 10% and a phase shift of between about 170° and 190° for light having a wavelength of about 365 nanometers.

5. The method of claim 1 wherein said layer of opaque material is chrome having a thickness of between about 80 and 120 nanometers.

6. The method of claim 1 wherein said pellicle is formed of aluminum.

7. The method of claim 1 wherein said pellicle has a thickness of between about 5 and 6 millimeters.

8. A method of forming attenuating phase shift masks, comprising the steps of:

providing a transparent mask substrate having a primary surface;

forming a layer of attenuating phase shifting material on said primary surface of said transparent mask substrate;

forming a layer of opaque material on said layer of attenuating phase shifting material wherein said layer of opaque material consists of a pattern region and an alignment region and said alignment region is at the periphery of said layer of opaque material;

dispensing a layer of first resist material on said layer of opaque material;

baking said layer of first resist material;

exposing a first pattern in said layer of first resist material;

developing said layer of first resist material after exposing said layer of first resist material thereby forming said first pattern in said layer of resist;

forming said first pattern in said pattern region of said layer of opaque material using wet etching and said first pattern formed in said layer of first resist material as a mask;

removing said layer of first resist material after forming said first pattern in said pattern region of said layer of layer of opaque material;

forming said first pattern in said layer of attenuating phase shifting material by means of reactive ion etching using said first pattern in said pattern region of said layer of opaque material as a mask;

placing a pellicle over said pattern region of said layer of opaque material after forming said first pattern in said layer of attenuating phase shifting material wherein said pellicle covers said pattern region of said layer of opaque material and does not cover said alignment region of said layer of opaque material;

dispensing a layer of second resist material over said alignment region of said layer of opaque material;

removing said pellicle after dispensing said layer of second resist material;

baking said layer of second resist material thereby forming a mask in said layer of second resist material wherein second resist material covers said alignment region of said layer of opaque material;

etching away said pattern region of said layer of opaque material using wet etching and said mask formed in said layer of second resist material; and removing said layer of second resist material after etching away said pattern region of said layer of opaque material thereby forming an attenuating phase shifting mask.

9. The method of claim 8 wherein said layer of attenuating phase shifting material is MoSiON having a thickness of between about 80 and 120 nanometers.

10. The method of claim 8 wherein said layer of attenuating phase shifting material is CrON having a thickness of between about 100 and 140 nanometers.

11. The method of claim 8 wherein said layer of attenuating phase shifting material has a transmittance of between about 6% and 10% and a phase shift of between about 170° and 190° for light having a wavelength of about 365 nanometers.

12. The method of claim 8 wherein said layer of opaque material is chrome having a thickness of between about 80 and 120 nanometers.

13. The method of claim 8 wherein said pellicle is formed of aluminum.

14. The method of claim 8 wherein said pellicle has a thickness of between about 4 and 6 millimeters.

15. A method of forming a phase shift mask, comprising the steps of:

providing a phase shift mask semi-product including at least a transparent mask substrate, a patterned layer of attenuating phase shift material on said substrate, and a patterned layer of opaque material on top;

placing a pellicle over a first portion of said layer of opaque material, leaving the remaining second portion of said layer of opaque material uncovered;

coating a first layer of resist material on the remaining second portion of said layer of opaque material;

removing said pellicle;

etching said first portion of said layer of opaque material; and removing said first layer of resist material.

16. The method as claimed in claim 15, wherein said phase shift mask semi-product is obtained by a process comprising the steps of:

providing said transparent mask substrate;

forming an unpatterned layer of attenuating phase shift material on said transparent mask substrate;

forming an unpatterned layer of opaque material on said unpatterned layer of attenuating phase shift material;

coating a second layer of resist material on said unpatterned layer of opaque material;

patterning said second layer of resist material to obtain a desired pattern;

wet etching said unpatterned layer of opaque material according to said desired pattern to obtain said patterned layer of opaque material;

removing said second layer of resist material; and anisotropically etching said unpatterned layer of attenuating phase shift material according to the pattern on said patterned layer of opaque material to obtain said patterned layer of attenuating phase shift material.

17. The method as claimed in claim 15 wherein said attenuating phase shift material is MoSiON having a thickness of between about 80 and 120 nanometers.

18. The method as claimed in claim 15 wherein said attenuating phase shift material is CrON having a thickness of between about 100 and 140 nanometers.

19. The method as claimed in claim 15 wherein said attenuating phase shift material has a transmittance of between about 6% and 10% and a phase shift of between about 170° and 190° for light having a wavelength of about 365 nanometers.

20. The method as claimed in claim 15 wherein said opaque material is chrome having a thickness of between about 80 and 120 nanometers.

21. The method as claimed in claim 15 wherein said pellicle is formed of aluminum.

22. The method as claimed in claim 15 wherein said pellicle has a thickness of between about 5 and 6 millimeters.

* * * * *

UNITED STATES PATENT AND TRADEMARK OFFICE
CERTIFICATE OF CORRECTION

PATENT NO.   : 5,792,578
DATED        : 8/11/98
INVENTOR(S)  : San-De Tzu, Jia-Jinq Wang, Chih-Chiang Tu, Wen-Hong Huang It is certified that error appears in the above-indentified patent and that said Letters Patent is hereby corrected as shown below:

On the Cover Page, item [75], delete "JIA-JING WANG" and replace with --JIA-JINQ WANG--.

Signed and Sealed this

Twenty-ninth Day of December, 1998

Attest:

BRUCE LEHMAN

Attesting Officer    Commissioner of Patents and Trademarks